United States Patent
Jung et al.

(10) Patent No.: US 6,548,613 B2
(45) Date of Patent: Apr. 15, 2003

(54) ORGANIC ANTI-REFLECTIVE COATING POLYMER AND PREPARATION THEREOF

(75) Inventors: Min-Ho Jung, Gyunggi-do (KR); Sung-Eun Hong, Gyunggi-do (KR); Jae-Chang Jung, Gyunggi-do (KR); Geun-Su Lee, Gyunggi-do (KR); Ki-Ho Baik, Gyunggi-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 41 days.

(21) Appl. No.: 09/747,364

(22) Filed: Dec. 22, 2000

(65) Prior Publication Data

US 2001/0034427 A1 Oct. 25, 2001

(30) Foreign Application Priority Data

Dec. 23, 1999 (KR) ............................................. 99-61344

(51) Int. Cl.$^7$ ............................................. C08F 220/18
(52) U.S. Cl. ..................... 526/329.6; 526/311; 526/312; 526/315; 526/320; 526/325; 526/326; 526/328.5; 526/332; 430/270.1; 430/271.1
(58) Field of Search .............................. 526/329.6, 311, 526/312, 320, 325, 326, 328.5, 332, 315, 219.6; 430/270.1, 271.1

(56) References Cited

U.S. PATENT DOCUMENTS

| | | | |
|---|---|---|---|
| 4,424,270 A | 1/1984 | Erdmann et al. | 430/166 |
| 4,822,718 A | 4/1989 | Latham et al. | 430/271 |
| 5,525,457 A | 6/1996 | Nemoto et al. | 430/325 |
| 5,674,648 A | 10/1997 | Brewer et al. | 430/18 |
| 6,309,790 B1 * | 10/2001 | Jung et al. | 430/270.1 |
| 6,350,818 B1 * | 2/2002 | Hong et al. | 525/328.8 |
| 6,368,768 B1 * | 4/2002 | Jung e tal. | 430/270.1 |
| 6,388,039 B1 * | 5/2002 | Jung et al. | 526/311 |
| 6,395,397 B2 * | 5/2002 | Hong et al. | 427/386 |

* cited by examiner

Primary Examiner—Tatyana Zalukaeva
(74) Attorney, Agent, or Firm—Townsend and Townsend and Crew LLP

(57) ABSTRACT

The present invention provides a polymer that can be used as an anti-refelctive coating (ARC) polymer, an ARC composition comprising the same, methods for producing the same, and methods for using the same. The polymer of the present invention is particularly useful in a submicrolithographic process, for example, using KrF (248 nm), ArF (193 nm), or $F_2$ (157 nm) laser as a light source. The polymer of the present invention comprises a chromophore that is capable of absorbing light at the wavelengths used in a submicrolithographic process. Thus, the ARC of the present invention significantly reduces or prevents back reflection of light and the problem of the CD alteration caused by the diffracted and/or reflected light. The ARC of the present invention also significantly reduces or eliminates the standing wave effect and reflective notching. Therefore, the polymer of the present invention can be used to produce a stable ultrafine pattern that is suitable in manufacturing of 64 M, 256 M, 1 G, 4 G and 16 G DRAM semiconductor devices. Moreover, the ARC of the present invention significantly improves the production yield, of such semiconductor devices.

30 Claims, No Drawings

ORGANIC ANTI-REFLECTIVE COATING POLYMER AND PREPARATION THEREOF

BACKGROUND OF THE INVENTION

1. Field of the Invention

The present invention relates to an anti-reflective polymer that is useful in a submicrolithographic process, a composition comprising the polymer, and a method for preparing the same. In particular, the present invention relates to a polymer that can be used in an anti-reflective coating layer to reduce or prevent back reflection of light and/or to eliminate the standing waves in the photoresist layer during a submicrolithographic process. The present invention also relates to a composition comprising the polymer, and a method for using the same.

2. Description of the Prior Art

In most submicrolithographic processes standing waves and/or reflective notching of the waves typically occur due to the optical properties of the lower layer coated on a substrate and/or due to changes in the thickness of a photosensitive (i.e., photoresist) film applied thereon. In addition, typical submicrolithographic processes suffer from a problem of CD (critical dimension) alteration caused by diffracted and/or reflected light from the lower layer.

One possible solution is to apply an anti-reflective coating (i.e., ARC) between the substrate and the photosensitive film. Useful ARCs have a high absorbance of the light wavelengths that are used in submicrolithographic processes. ARCs can be an inorganic an organic material, and they are generally classified as "absorptive" or "interfering" depending on the mechanism. For a microlithographic process using I-line (365 nm wavelength) radiation, inorganic anti-reflective films are generally used. Typically, TiN or amorphous carbon (amorphous-C) materials are used for an absorptive ARC and SiON materials are typically used for an interfering ARC.

SiON-based anti-reflective films have also been adapted for submicrolithographic processes that use a KrF light source. Recently, use of an organic compound as ARC has been investigated. It is generally believed that an organic compound based ARCs are particularly useful in submicrolithographic processes, in particular those using an ArF light source.

In order to be useful as an ARC, an organic compound needs to have many diverse and desirable physical properties. For example, a cured ARC should not be soluble in solvents because dissolution of the organic ARC can cause the photoresist composition layer to peel-off in a lithographic process. One method for reducing the solubility of cured ARC is to include cross-linking moieties such that when cured the ARC becomes cross-linked and becomes insoluble in most solvents used in lithographic processes. In addition, there should be minimum amount of migration (i.e., diffusion), if at all, of materials, such as acids and/or amines, to and from the ARC. If acids migrate from the ARC to an unexposed area of the positive photoresist film, the photosensitive pattern is undercut. If bases, such as amines, diffuse from the ARC to an unexposed area of the positive photoresist film a footing phenomenon occurs. Moreover, ARC should have a faster etching rate than the upper photosensitive (i.e., photoresist) film to allow the etching process to be conducted smoothly with the photosensitive film serving as a mask. Preferably, an organic ARC should be as thin as possible and have an excellent light reflection prevention property.

While a variety of ARC materials are currently available, none of these materials is useful in ArF laser submicrolithographic processes. In the absence of an ARC, the irradiated light penetrates into the photoresist film and is back reflected or scattered from its lower layers or the surface of the substrate (e.g., semiconductor chip), which affects the resolution and/or the formation of a photoresist pattern.

Therefore, there is a need for an ARC material which have a high absorbance of the wavelengths used in submicrolithographic processes.

SUMMARY OF THE INVENTION

It is an object of the present invention to provide an organic polymer that can be used as an ARC material in ArF laser (193 nm) or KrF laser (248 nm) submicrolithographic processes.

It is another object of the present invention to provide a method for preparing an organic polymer that reduces or prevents diffusion and/or light reflection in submicrolithographi processes.

It is a further object of the present invention to provide an ARC composition comprising such an organic diffusion/reflection preventing or reducing polymer and a method for producing the same.

It is a still further object of the present invention to provide a method for producing a photoresist pattern using ArF laser submicrolithographic processes with reduced standing wave effect.

It is yet another object of the present invention to provide a semiconductor device which is produced using the ARC composition in a submicrolithographic process.

DETAILED DESCRIPTION OF THE INVENTION

Alkyl groups according to the present invention are aliphatic hydrocarbons which can be straight or branched chain groups. Alkyl groups optionally can be substituted with one or more substituents, such as a halogen, alkenyl, alkynyl, aryl, hydroxy, amino, thio, alkoxy, carboxy, oxo or cycloalkyl. There may be optionally inserted along the alkyl group one or more oxygen, sulfur or substituted or unsubstituted nitrogen atoms. Exemplary alkyl groups include methyl, ethyl, i-propyl, n-butyl, t-butyl, fluoromethyl, difluoromethyl, trifluoromethyl, chloromethyl, trichloromethyl, and pentafluoroethyl.

One aspect of the present invention provides an acrylate polymer and an ARC comprising the same. In one particular embodiment, polymers have a high absorbance of light wavelengths of 193 nm and 248 nm. The polymer can further comprise a cross-linking moiety such that the polymer becomes cross-linked when heated (i.e., cured or "hard baked"). Cross-linking moieties can comprise an alcohol group and other functional groups which is capable of reacting with the alcohol group to form a cross-linkage. It is believed that cross-linking of the polymer significantly improves the adhesiveness and the dissolution properties of the ARC.

Polymers of the present invention are capable of forming a high degree of cross-linkage and have high stability, i.e., they can be stored for a long period of time without any significant degradation. In particular, uncured ARC polymers of the present invention are soluble in most hydrocarbon solvents; however, when cured, they are substantially insoluble in most solvents. Thus, polymers of the present invention can be easily coated onto a substrate and are capable of preventing undercutting and footing problems that can occur during a photoresist pattern formation on photosensitive materials (i.e., photoresist compositions). Moreover, ARCs of the present invention have a higher etching rate than conventional photosensitive films resulting in an improved etching ratio between ARCs and photosensitive films, i.e., higher etching selectivity.

One embodiment of the present invention provides an ARC polymer is selected from the group consisting of a polymer of the formula:

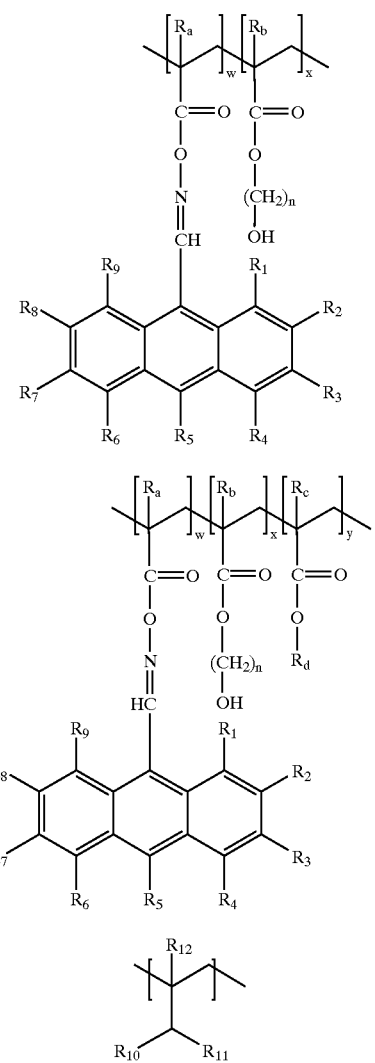

or mixtures thereof,
wherein
$R_a$, $R_b$, $R_c$, and $R_{12}$ are independently hydrogen or alkyl (preferably methyl);
$R_d$ is alkyl;
$R_1$ to $R_9$ are independently hydrogen, hydroxy, alkoxycarbonyl, carboxyl, hydroxyalkyl, or optionally substituted $C_1$–$C_5$ alkyl, or alkoxyalkyl;
$R_{10}$ and $R_{11}$ are independently optionally substituted $C_1$–$C_{10}$ alkoxy;
w, x, and y are mole fractions, each of which is independently in the range of from 0.01 to 0.99; and
n is an integer of 1 to 4.

Alkyl groups according to the present invention are aliphatic hydrocarbons which can be straight or branched chain groups. Alkyl groups optionally can be substituted with one or more substituents, such as a halogen, alkenyl, alkynyl, aryl, hydroxy, amino, thio, alkoxy, carboxy, oxo or cycloalkyl. There may be optionally inserted along the alkyl group one or more oxygen, sulfur or substituted or unsubstituted nitrogen atoms. Exemplary alkyl groups include methyl, ethyl, i-propyl, n-butyl, t-butyl, fluoromethyl, difluoromethyl, trifluoromethyl, chloromethyl, trichloromethyl, and pentafluoroethyl.

The terminal groups of a polymer depicted in the present disclosure depend on the particular polymerization initiator used. In addition, as used throughout this disclosure, it should be appreciated that the order of monomeric units represented in a polymer formula does not necessarily indicate the actual order of such monomeric units in the polymer. Monomeric units represented in a polymer formula are intended to simply indicate the presence of such monomeric units in the polymer. Moreover, the variables represent the total relative ratio of each unit. For example, the total amount "w" in Formula 1 above can be inter dispersed throughout the polymer (not necessarily in same concentrations) or all or majority of such polymeric unit can be concentrated in one particular location of the polymer.

Particularly useful polymers of Formula 3 include the following polymers:

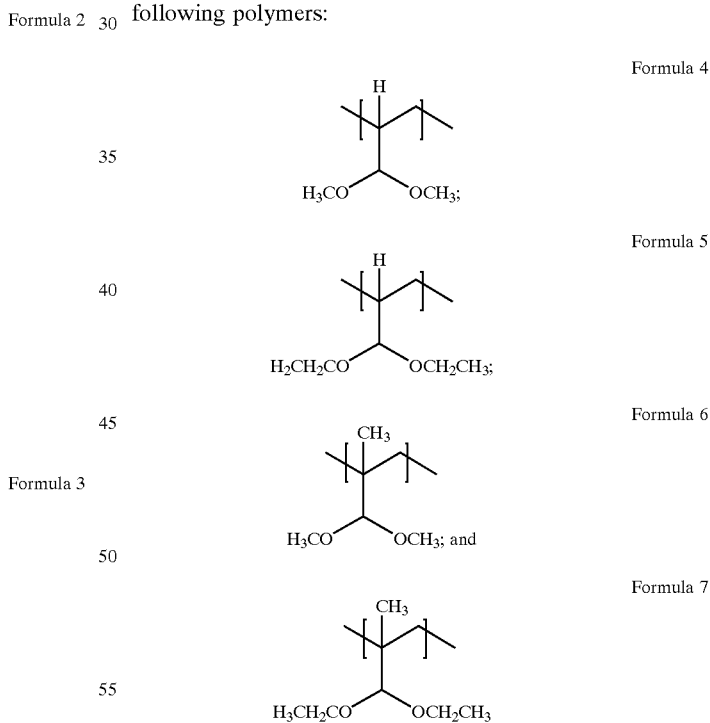

Polymers of Formulas 4 to 7 can be cured by contacting with an alcohol-containing compound in the presence of an acid.

Another aspect of the present invention provides a method for producing polymers disclosed above.

In one aspect of the present invention, polymer of the Formula 1 is produced by polymerizing a mixture of monomers comprising a 9-anthraldehydeoximeacrylate monomer of the formula:

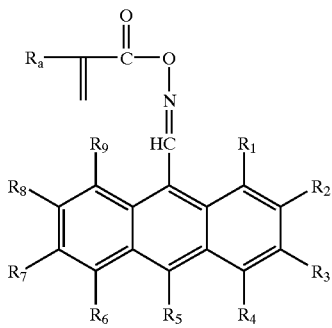

and a hydroxyalkylacrylate monomer of the formula:

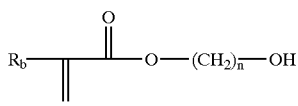

where $R_a$, $R_b$, $R_1$ to $R_9$, w, x, and n are those defined above.

Polymer of the Formula 2 can be prepared by polymerizing a mixture of monomers comprising 9-anthraldehydeoximeacrylate monomer of the formula:

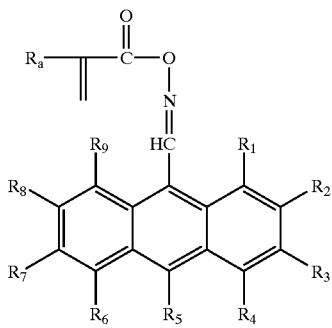

a hydroxyalkylacrylate monomer of the formula:

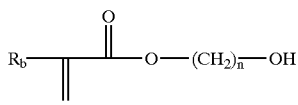

and an alkylacrylate monomer of the formula:

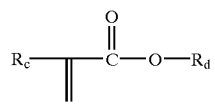

where $R_a$, $R_b$, $R_c$, $R_d$, $R_1$ to $R_9$, w, x, y, and n are those defined above.

The polymerization reactions disclosed above can include a polymerization initiator. Suitable polymerization initiators are well known to one of ordinary skill in the art including polymerization initiators that are used in conventional radical polymerization reactions such as 2,2,-azobisisobutyronitrile (AIBN), acetylperoxide, laurylperoxide and t-butylperoxide.

The polymerization reactions disclosed above can also include a polymerization solvent. Suitable polymerization solvents are well known to one of ordinary skill in the art. Exemplary polymerization solvents include organic solvents that are used in conventional polymerization reaction. Preferably, the polymerization solvent is selected from the group consisting of tetrahydrofuran, toluene, benzene, methylethyl ketone and dioxane.

Preferably, the polymerization reaction is conducted at temperature in the range of from about 50° C. to about 80° C.

In another aspect of the present invention, the polymer of Formula 3 is produced by polymerizing (meth)acrolein and reacting the resulting polymer with $C_1$–$C_{10}$ alkyl alcohol. In one particular embodiment, (meth)acrolein is polymerized at 60–70° C. for 4–6 hours under vacuum in the presence of a polymerization initiator in an organic solvent. The resulting polymer is reacted with $C_1$–$C_{10}$ alkyl alcohol at room temperature for 20–30 hours in the presence of an acid catalyst, e.g., trifluoromethylsulfonic acid. While any of the conventional organic solvents used in polymerization reaction can be used, preferably the organic solvent for polymerization is selected from the group consisting of tetrahydrofuran (THF), cyclohexanone, dimethylformamide, dimethylsulfoxide, dioxane, methylethyl ketone, benzene, toluene, xylene and mixtures thereof. Preferably, the polymerization initiator is selected from the group consisting of AIBN, benzoylperoxide, acetylperoxide, laurylperoxide, t-butylperacetate, t-butylhydroperoxide, and di-t-butylperoxide.

Examples of the $C_1$–$C_{10}$ alkyl alcohol include methanol, ethanol, propanol, butanol, pentanol, hexanol, heptanol, octanol, nonanol, decanol, and isomers thereof. In particular, methanol and ethanol are preferred.

Another aspect of the present invention provides an ARC composition comprising the polymer of Formula 1, 2, or combinations thereof. The ARC composition can further comprise the polymer of Formula 3.

The ARC composition of the present invention can also comprise an an additive. Useful additives include, but are not limited to, anthracene derivatives selected from the group consisting of anthracene, 9-anthracenemethanol, 9-anthracenecarbonitrile, 9-anthracenecarboxylic acid, dithranol, 1,2,10-anthracenetriol, anthraflavonic acid, 9-anthraldehydeoxime, 9-anthraldehyde, 2-amino-7-methyl-5-oxo-5H-[1]benzopyrono[2,3-b]benzopyridine-3-carbonitrile, 1-aminoanthraquinone, anthraquinone-2-carboxylic acid, 1,5-dihydroxyanthraquinone, anthrone, 9-anthryltrifluoromethyl ketone, 9-alkylanthracene derivatives of the Formula:

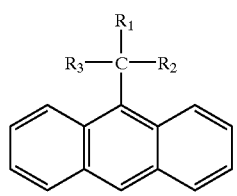

carboxylanthracene derivatives of the Formula:

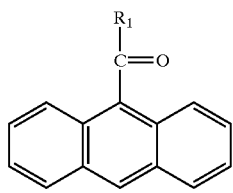

carboxylanthracene derivatives of the Formula:

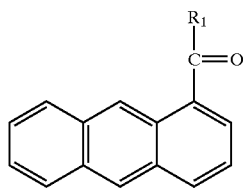

and mixtures thereof, where $R_1$, $R_2$, and $R_3$ are those defined above.

Another aspect of the present invention provides a method for coating the ARC composition described above on a substrate, e.g., semiconductor. In one particular embodiment, the ARC composition described above is admixed with an organic solvent, coated onto a substrate (i.e., base layer) and heated (i.e., hard-baked). The solution can be filtered prior to being coated onto the substrate. Typically, any organic solvent which can at least partially dissolve the ARC composition can be used. However, ethyl 3-ethoxypropionate, methyl 3-methoxypropionate, cyclohexanone, and propylene glycol methyletheracetate are particularly preferred. The amount of solvent used is preferably in the range of from about 200 to about 5,000% by weight of the total weight of the ARC polymer used.

Heating of the coated substrate is preferably conducted at temperature in the range of from about 100° C. to about 300° C. for a period of from about 10 sec. to about 1,000 sec. Heating the coated substrate produces a film of cross-linked ARC polymer.

It has been found by the present inventors that the ARCs of the present invention exhibit high performance in sub-microlithographic processes, in particular using KrF (248 nm), ArF (193 nm) and $F_2$ (157 nm) lasers as a light source.

In accordance with yet another aspect, the present invention provides a semiconductor device produced using the ARC composition described above.

Additional objects, advantages, and novel features of this invention will become apparent to those skilled in the art upon examination of the following examples thereof, which are not intended to be limiting.

EXAMPLE I

Synthesis of Poly[9-anthraldehydeoximeacrylate-(2-hydroxyethylacrylate)] Copolymer Synthesis of 9-Anthraldehydeoximeacrylate To a solution of tetrahydrofuran was added 0.5 mole of 9-anthraldehydeoxime, 0.5 mole of pyridine and 0.5 mole of acryloyl chloride. The reaction was monitored and when no more significant reaction occurred it was filtered, diluted with ethyl acetate, and washed with water. The organic phase was dried and concentrated by distillation under vacuum to provide 9-anthraldehydeoximeacrylate of Formula 11. Yield 82%.

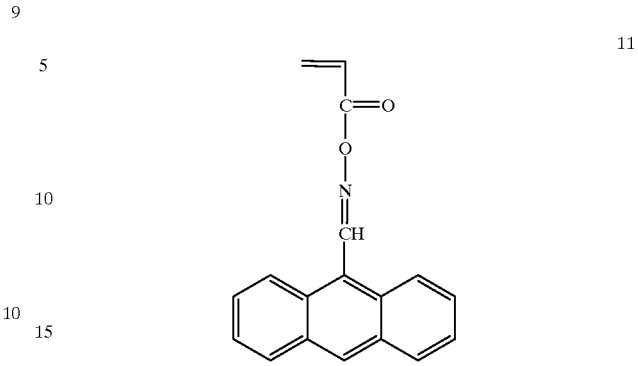

Synthesis of Poly[9-anthraldehydeoximeacrylate-(2-hydroxyethylacrylate)] Copolymer To a 500 ml round-bottom flask was added 0.5 mole of 9-anthraldehydeoximeacrylate, 0.5 mole of 2-hydroxyethylacrylate, 300 g of tetrahydrofuran (THF), and 0.1–3 g of 2,2'-azobisisobutyronitrile (AIBN). The reaction mixture was heated to about 60 to about 75° C. for 5–20 hours under nitrogen atmosphere. The reaction mixture was precipitated in ethyl ether or n-hexane and the precipitate was filtered and dried to provide a poly[9-anthraldehydeoximeacrylate-(2-hydroxyethylacrylate)] copolymer of Formula 12. Yield: 82%.

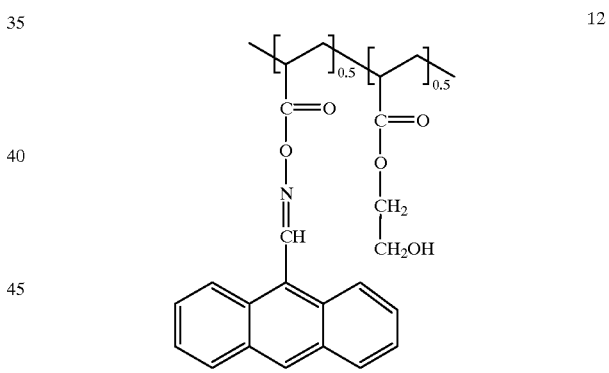

EXAMPLE II

Synthesis of Poly[9-anthraldehydeoximeacrylate-(3-hydroxypropylacrylate)] Copolymer To a 500 ml round-bottom flask was added 0.5 mole of 9-anthraldehydeoximeacrylate (prepared according to the procedure of Example 1), 0.5 mole of 3-hydroxypropylacrylate, 300 g of THF, and 0.1–3 g of AIBN. The reaction mixture was heated to 60–75° C. for 5–20 hours under nitrogen atmosphere. The resulting solution was precipitated in ethyl ether or n-hexane, and the precipitate was filtered and dried to provide poly[9-anthraldehydeoximeacrylate-(3-hydroxypropylacrylate)] copolymer of Formula 13. Yield: 82%.

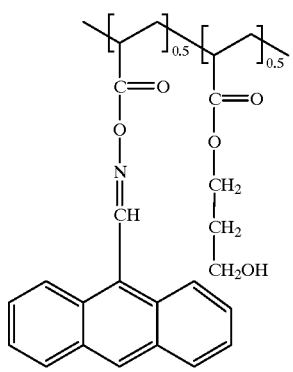

13

EXAMPLE III

Synthesis of Poly[9-anthraldehydeoximeacrylate-(4-hydroxybutylacrylate)] Copolymer To a 500 ml round-bottom flask was added 0.5 mole of 9-anthraldehydeoximeacrylate (prepared according to the procedure of Example I), 0.5 mole of 4-hydroxybutylacrylate, 300 g of THF, and 0.1–3 g of AIBN. The reaction mixture was heated to 60–75° C. for 5–20 hours under nitrogen atmosphere. The resulting solution was precipitated in ethyl ether or n-hexane, and the precipitate was filtered and dried to provide poly[9-anthraldehydeoximeacrylate-(4-hydroxybutylacrylate)] copolymer of Formula 14. Yield: 80%.

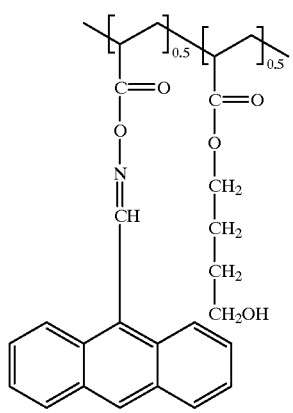

14

EXAMPLE IV

Synthesis of Poly[9-anthraldehydeoximemethacrylate-(2-hydroxyethylacrylate)] Copolymer Synthesis of 9-Anthraldehydeoximemethacrylate To a solution of THF was added 0.5 mole of 9-anthraldehydeoxime, 0.5 mole of pyridine, and 0.5 mole of methacryloyl chloride. The reaction was monitored and when no more significant reaction occurred it was filtered, diluted with ethyl acetate, and washed with water. The organic phase was dried and concentrated by distillation under vacuum to provide 9-anthraldehydeoximemethacrylate of Formula 15. Yield 80%.

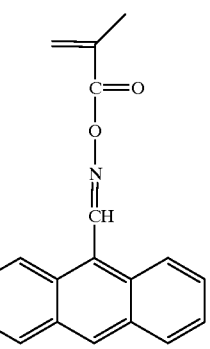

15

Synthesis of poly[9-anthraldehydeoximemethacrylate-(2-hydroxyethylacrylate)] Copolymer To a 500 ml round-bottom flask was added 0.5 mole of 9-anthraldehydeoximemethacrylate, 0.5 mole of 2-hydroxyethylacrylate, 300 g of THF, and 0.1–3 g of AIBN. The reaction mixture was heated to 60–75° C. for 5–20 hours under nitrogen atmosphere. The resulting solution was precipitated in ethyl ether or n-hexane, and the precipitate was filtered and dried to provide poly[9-anthraldehydeoximemethacrylate-(2-hydroxyethylacrylate)] copolymer of Formula 16. Yield: 78%.

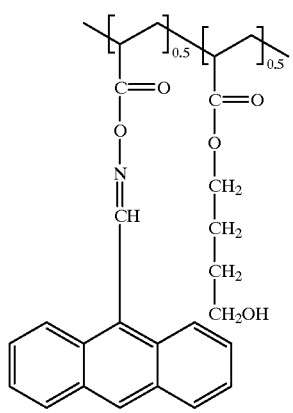

16

EXAMPLE V

Synthesis of Poly[9-anthraldehydeoximemethacrylate-(3-hydroxypropylacrylater)] Copolymer To a 500 ml round-bottom flask was added 0.5 mole of 9-anthraldehydeoximemethacrylate (prepared according to the procedure of Example IV), 0.5 mole of 3-hydroxypropylacrylate, 300 g of THF, and 0.1–3 g of AIBN. The reaction mixture was heated to 60–75° C. for 5–20 hours under nitrogen atmosphere. The resulting solution was precipitated in ethyl ether or n-hexane, and the precipitate was filtered and dried to provide poly[9-anthraldehydeoximemethacrylate-(3-hydroxypropylacrylate)] copolymer of Formula 17. Yield 81%.

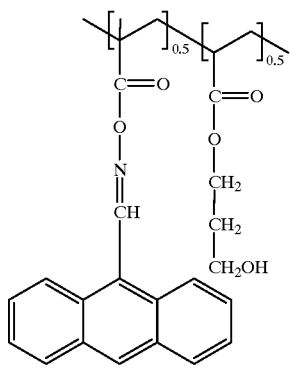

17

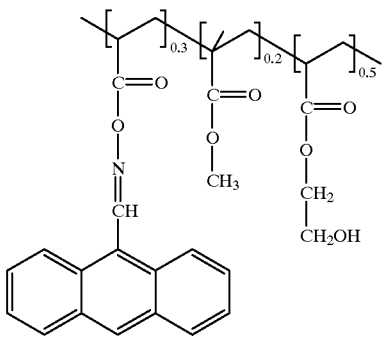

19

EXAMPLE VI

Synthesis of Poly[9-anthraldehydeoximemethacrylate-(4-hydroxybutylacrylate)] Copolymer To a 500 ml round-bottom flask was added 0.5 mole of 9-anthraldehydeoximemethacrylate (prepared according to the procedure of Example IV), 0.5 mole of 4-hydroxybutylacrylate, 300 g of THF, and 0.1–3 g of AIBN. The reaction mixture was heated to 60–75° C. for 5–20 hours under nitrogen atmosphere. The resulting solution was precipitated in ethyl ether or n-hexane, and the precipitate was filtered and dried to provide poly[9-anthraldehydeoximemethacrylate-(4-hydroxybutyl-acrylate)] copolymer of Formula 18. Yield: 80%.

EXAMPLE VIII

Synthesis of Poly[9-anthraldehydeoximeacrylate-(3-hydroxypropylacrylate)-methylmethacrylate] Copolymer To a 500 ml round-bottom flask was added 0.3 mole of 9-anthraldehydeoximeacrylate, 0.5 mole of 3-hydroxypropylacrylate, 0.2 mole of methylmethacrylate, 300 g of THF, and 0.1–3 g of AIBN. The reaction mixture was heated to 60–75° C. for 5–20 hours under nitrogen atmosphere. The resulting solution was precipitated in ethyl ether or n-hexane, and the precipitate was filtered and dried to provide poly[9-anthraldehydeoximeacrylate-(3-hydroxypropylacrylate)-methylmethacrylate] copolymer of Formula 20. Yield: 80%.

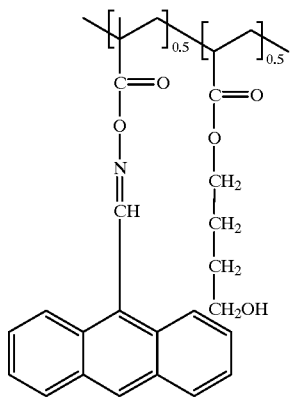

18

20

EXAMPLE VII

Synthesis of Poly[9-anthraldehydeoximeacrylate-(2-hydroxyethylacrylate)-methylmethacrylate] Copolymer To a 500 ml round-bottom flask was added 0.3 mole of 9-anthraldehydeoximeacrylate, 0.5 mole of 2-hydroxyethylacrylate, 0.2 mole of methylmethacrylate, 300 g of THF, and 0.1–3 g of AIBN. The reaction mixture was heated to 60–75° C. for 5–20 hours under nitrogen atmosphere. The resulting solution was precipitated in ethyl ether or n-hexane, and the precipitate was filtered and dried to provide poly[9-anthraldehydeoximeacrylate-(2-hydroxyethylacrylate)-methylmethacrylate] copolymer of Formula 19. Yield: 79%.

EXAMPLE IX

Synthesis of Poly[9-anthraldehydeoximeacrylate-(4-hydroxybutylacrylate)-methylmethacrylate] Copolymer To a 500 ml round-bottom flask was added 0.3 mole of 9-anthraldehydeoximeacrylate, 0.5 mole of 4-hydroxybutylacrylate, 0.2 mole of methylmethacrylate, 300 g of THF, and 0.1–3 g of AIBN. The reaction mixture was heated to 60–75° C. for 5–20 hours under nitrogen atmosphere. The resulting solution was precipitated in ethyl ether or n-hexane, and the precipitate was filtered and dried to provide poly[9-anthraldehydeoximeacrylate-(4-hydroxybutylacrylate)-methylmethacrylate] copolymer of Formula 21. Yield 80%.

21

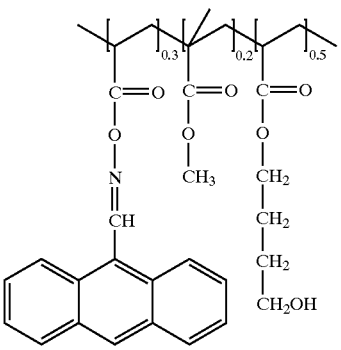

EXAMPLE X

Synthesis of Poly[9-anthraldehydeoximemethacrylate-(2-hydroxyethylacrylate)-methylmethacrylate] Copolymer To a 500 ml round-bottom flask was added 0.3 mole of 9-anthraldehydeoximemethacrylate (prepared according to the procedure of Example IV), 0.5 mole of 2-hydroxyethylacrylate, 0.2 mole of methylmethacrylate, 300 g of THF, and 0.1–3 g of AIBN. The reaction mixture was heated to 60–75° C. for 5–20 hours under nitrogen atmosphere. The resulting solution was precipitated in ethyl ether or n-hexane, and the precipitate was filtered and dried to provide poly[9-anthraldehydeoximemethacrylate-(2-hydroxyethylacrylate)-methylmethacrylate] copolymer of Formula 22. Yield: 79%.

22

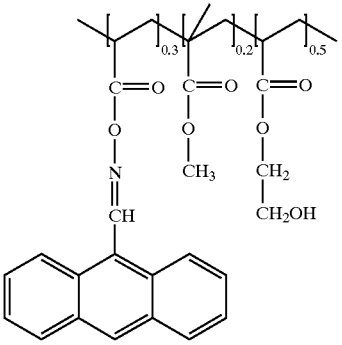

EXAMPLE XI

Synthesis of Poly[9-anthraldehydeoximemethacrylate-(3-hydroxypropylacrylate)-methylmethacrylate] Copolymer To a 500 ml round-bottom flask was added 0.3 mole of 9-anthraldehydeoximemethacrylate (prepared according to the procedure of Example IV), 0.5 mole of 3-hydroxypropylacrylate, 0.2 mole of methylmethacrylate, 300 g of THF, and 0.1–3 g of AIBN. The reaction mixture was heated to 60–75° C. for 5–20 hours under nitrogen atmosphere. The resulting solution was precipitated in ethyl ether or n-hexane, and the precipitate was filtered and dried to provide poly[9-anthraldehydeoximemethacrylate-(3-hydroxypropylacrylate)-methylmethacrylate] copolymer of Formula 23. Yield: 80%.

23

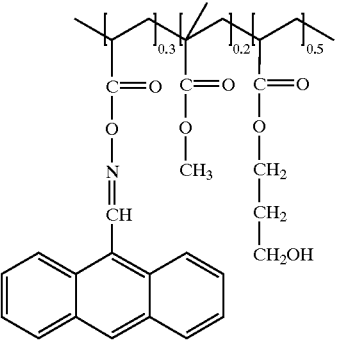

EXAMPLE XII

Synthesis of Poly[9-antrhaldehydeoximemethacrylate-(4-hydroxybutylacrylate)-methylmethacrylate] Copolymer To a 500 ml round-bottom flask was added 0.3 mole of 9-anthraldehydeoximemethacrylate (prepared according to the procedure of Example IV), 0.5 mole of 4-hydroxybutylacrylate, 0.2 mole of methylmethacrylate, 300 g of THF, and 0.1–3 g of AIBN. The reaction mixture was heated to 60–75° C. for 5–20 hours under nitrogen atmosphere. The resulting solution was precipitated in ethyl ether or n-hexane, and the precipitate was filtered and dried to provide poly[9-anthraldehydeoximemethacrylate-(4-hydroxybutylacrylate)-methylmethacrylate] copolymer of Formula 24. Yield 78%.

24

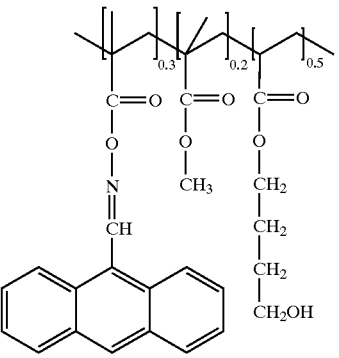

EXAMPLE XIII

Synthesis of Poly[acroleindimethylacetal] Resin

To a 500 ml round-bottom flask was added 100 g of acrolein, 66 g of THF, and 2 g of AIBN. The reaction mixture was heated to 65° C. for 5 hours under vacuum. The white precipitate (i.e., polyacrolein) was filtered and washed with ethyl ether. Yield: 80%. To a 1000 ml round-bottom flask was added 80 g of the white solid, 500 g of methanol, and 1 ml of trifluoromethyl sulfonic acid. The resulting mixture was stirred at room temperature for 24 hours or longer. The white solid dissolved as the reaction proceeded. The progress of the reaction was monitored using an IR spectrophotometer. When the absorption band at 1690 cm$^{-1}$ had substantially disappeared in the IR spectrum, the reaction mixture was neutralized by adding triethylamine. Excess methanol was removed by distillation. The viscous residue was precipitated in distilled water and dried in vacuo to afford the polymer of Formula 4.

Yield: 65%. Molecular weight: 6,820. Polydispersity: 1.60 $^1$H NMR (δ): 1.2–2.1 (3H), 3.0–3.8 (6H), 3.8–4.7 (1H).

EXAMPLE XIV

Synthesis of Poly[acroleindiethylacetal] Resin

To a 500 ml round-bottom flask was added 100 g of acrolein, 66 g of THF, and 2 g of AIBN. The reaction mixture was heated to 65° C. for 5 hours under vacuum. The white precipitate (i.e., polyacrolein) was filtered and washed with ethyl ether. Yield: 80%. To a 1000 ml round-bottom flask was added 80 g of the white solid, 500 g of ethanol, and 1 ml of trifluoromethyl sulfonic acid. The resulting mixture was stirred at room temperature for 24 hours or longer. The white solid dissolved as the reaction proceeded. The reaction was monitored using an IR spectrophotometer. When the absorption band at 1690 cm$^{-1}$ had substantially disappeared in the IR spectrum, the reaction mixture was neutralized by adding triethylamine. Excess ethanol was removed by distillation. The viscous residue was precipitated in distilled water and dried in vacuo to afford the polymer of Formula 5.

Yield: 60%. Molecular weight: 7,010. Polydispersity: 1.78 $^1$H NMR (δ) 1.2–2.1 (9H), 3.0–3.8 (4H), 3.8–4.7 (1H).

EXAMPLE XV

Synthsis of Poly[methacroleindimethylacetal] Resin

To a 500 ml round-bottom flask was added 100 g of methacrolein, 66 g of THF, and 2 g of AIBN. The reaction mixture was heated to 65° C. for 5 hours under vacuum. The white precipitate (i.e., polymethacrolein) was filtered and washed with ethyl ether. To a 1000 ml round-bottom flask was added 80 g of the white solid, 500 g of methanol, and 1 ml of trifluoromethyl sulfonic acid. The resulting mixture was stirred at room temperature for 24 hours or longer. The white solid dissolved as the reaction proceeded. The reaction was monitored using an IR spectrophotometer. When the absorption band at 1690 cm$^{-1}$ had substantially disappeared in the IR spectrum, the reaction mixture was neutralized by adding triethylamine. Excess methanol was removed by distillation. The viscous residue was precipitated in distilled water and dried in vacuo to afford the polymer of Formula 6.

Yield: 65%. Molecular weight: 6,800. Polydispersity: 1.63 $^1$H NMR (δ) 1.2–2.1 (5H), 3.0–3.8 (6H), 3.8–4.7 (1H).

EXAMPLE XVI

Synthesis of Poly[methacroleindiethylacetal] Resin

To a 500 ml round-bottom flask was added 100 g of methacrolein, 66 g of THF, and 2 g of AIBN. The reaction mixture was heated to 65° C. for 5 hours under vacuum. The white precipitate (i.e., polymethacrolein) was filtered and washed with ethyl ether. To a 1000 ml round-bottom flask was added 80 g of the white solid, 500 g of ethanol, and 1 ml of trifluoromethyl sulfonic acid. The resulting mixture was stirred at room temperature for 24 hours or longer. The white solid dissolved as the reaction proceeded. The reaction was monitored using an IR spectrophotometer. When the absorption band at 1690 cm$^{-1}$ had substantially disappeared in the IR spectrum, the reaction mixture was neutralized by adding triethylamine. Excess ethanol was removed by distillation. The viscous residue was precipitated in distilled water and dried in vacuo to afford the polymer of Formula 7.

Yield: 61%. Molecular weight: 7,200. Polydispersity: 2.0 $^1$H NMR (δ): 1.2–2.1 (11H), 3.0–3.8 (4H), 3.8–4.7 (1H).

EXAMPLE XVII

Preparation of ARC

One of the polymers of Examples I to XII and one of the polymers of Examples XIII to XVI were added to a solution of propyleneglycol methylether acetate (PGMEA). To this solution mixture was optionally added 0.1–30% by weight of at least one additive selected from the anthracene derivative group. The resulting mixture was filtered, coated onto a wafer, and hard-baked at 100–300° C. for 10–1,000 sec to form an ARC. A photosensitive material is coated on top of the ARC thus formed and imaged using a submicrolithographic process to form an ultrafine pattern.

Polymers of the present invention comprise a chromophore which is capable of absorbing light at the wavelengths which is used in a submicrolithographic process. Additionally, uncured polymer of the present invention is soluble in most hydrocarbon solvents while the cured (i.e., hard baked) polymer is insoluble in most solvents. Thus, polymers of the present invention can be easily coated onto a substrate and are capable of preventing undercutting and footing problems that can occur during a photoresist pattern formation on photosensitive materials (i.e., photoresist compositions). Moreover, because polymers of the present invention comprise an acrylate polymer, the resulting ARC layer has a higher etching rate than photosensitive films (e.g., photoresist resin) resulting in a significantly improved etch selection ratio between the ARC and the photosensitive film.

ARCs of the present invention reduce or eliminate the back reflection of light from lower layers of the photosensitive film or the surface of the substrate (e.g., semiconductor element). In addition, ARCs of the present invention reduce or eliminate the standing waves effect due to the thickness changes in the photoresist layer during a submicrolithographic process using KrF (248 nm), ArF (193 nm), or F$_2$ (157 nm) laser as a light source. Thus, ARCs of the present invention are useful in forming an ultrafine photoresist pattern. In particular, use of ARCs of the present invention in submicrolithographic processes result in formation of a stable ultrafine pattern that are suitable for 64 M, 256 M, 1 G, 4 G and 16 G DRAM semiconductor devices. And since a stable pattern is formed, use of ARCs of the present invention greatly improves the production yield.

While the present invention has been described herein with reference to particular embodiments thereof, a latitude of modification, various changes and substitutions are intended in the foregoing disclosure. It will be appreciated that in some instances some features of the invention will be employed without a corresponding use of other features without departing from the scope of the invention as set forth herein. Therefore, many modifications may be made to adapt a particular situation or material to the teachings of the invention without departing from the essential scope and spirit of the present invention. It is intended that the invention not be limited to the particular embodiment disclosed as the best mode contemplated for carrying out this invention, but that the invention shall include all embodiments and equivalents falling within the scope of the appended claims.

What is claimed is:

1. A polymer of the formula:

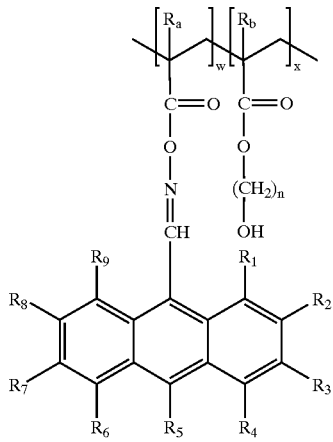

wherein $R_a$ and $R_b$ are independently hydrogen or alkyl;

$R_1$ to $R_9$ are independently hydrogen, hydroxy, alkoxycarbonyl, carboxyl, hydroxyalkyl, or optionally substituted $C_1$–$C_5$ alkyl or alkoxyalkyl w and x are mole fractions, each of which is independently in the range of from 0.01 to 0.99; and n is an integer of 1 to 4.

2. The polymer of claim 1, wherein $R_a$ and $R_b$ are independently hydrogen or methyl.

3. The polymer of claim 2, wherein $R_a$, $R_b$ and $R_1$ to $R_9$ are hydrogen; the ratio of w and x is 0.5:0.5; and n is 2, 3 or 4.

4. The polymer of claim 2, wherein $R_a$ is methyl; $R_b$ and $R_1$ to $R_9$ are hydrogen; the ratio of w and x is 0.5:0.5; and n is 2, 3 or 4.

5. A method for preparing a polymer of the formula:

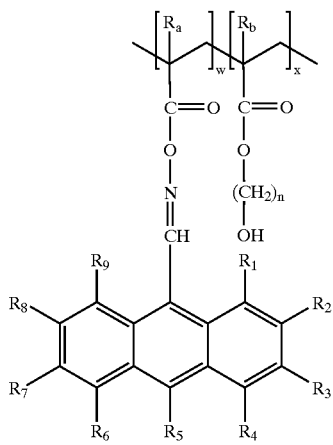

said method comprising the steps of polymerizing a mixture of monomers under conditions sufficient to produce said polymer, wherein said mixture of monomers comprises a 9-anthraldehydeoximeacrylate monomer of the formula:

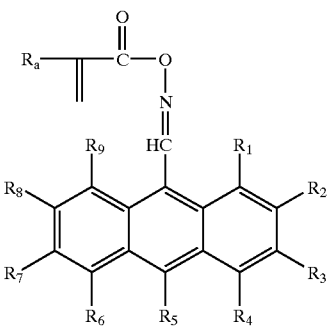

and a hydroxyalkylacrylate monomer of the formula:

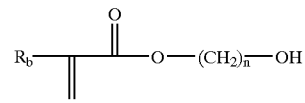

wherein $R_a$ and $R_b$ are independently hydrogen or alkyl;

$R_1$ to $R_9$ are independently hydrogen, hydroxy, alkoxycarbonyl, carboxyl, hydroxyalkyl, or optionally substituted $C_1$–$C_5$ alkyl, or alkoxyalkyl;

w and x are mole fractions, each of which is independently in the range of from 0.01 to 0.99; and n is an integer of 1 to 4.

6. The method of claim 5, wherein said mixture of monomers further comprises a polymerization initiator.

7. The method of claim 6, wherein said polymerization initiator is selected from the group consisting of 2,2-azobisisobutyronitrile, acetylperoxide, laurylperoxide, and t-butylperoxide.

8. The method of claim 6, wherein said mixture of monomers further comprises a solvent.

9. The method of claim 8, wherein said solvent is selected from the group consisting of tetrahydrofuran, toluene, benzene, methylethyl ketone and dioxane.

10. The method of claim 5, wherein said polymerization step comprises heating said mixture of monomers to temperature in the range of from about 50° C. to about 90° C.

11. A polymer of the formula:

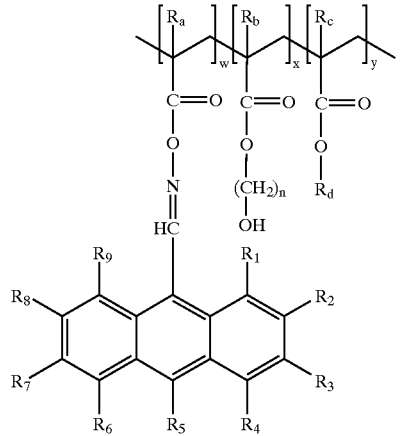

wherein $R_a$, $R_b$, and $R_c$ are independently hydrogen or alkyl;

$R_d$ is alkyl;

R₁ to R₉ are independently hydrogen, hydroxy, alkoxycarbonyl, carboxyl, hydroxyalkyl, or optionally substituted $C_1$–$C_5$ alkyl, or alkoxyalkyl;

w, x, and y are mole fractions, each of which is independently in the range of from 0.01 to 0.99; and n is an integer of 1 to 4.

12. The polymer of claim 11, wherein each of $R_a$, $R_b$, and $R_c$, is independently hydrogen or methyl; and $R_d$ is methyl.

13. The polymer of claim 12, wherein $R_a$, $R_b$, and $R_1$ to $R_9$ are hydrogen; $R_c$ and $R_d$ are methyl; the ratio of w, x, and y is about 0.3:0.5:0.2; and n is 2, 3 or 4.

14. The polymer of claim 12, wherein $R_a$, $R_c$, and $R_d$ are methyl; $R_b$ and $R_1$ to $R_9$ are hydrogen; the ratio of w, x and y is about 0.3:0.5:0.2; and n is 2, 3, or 4.

15. A method for producing a polymer of the formula:

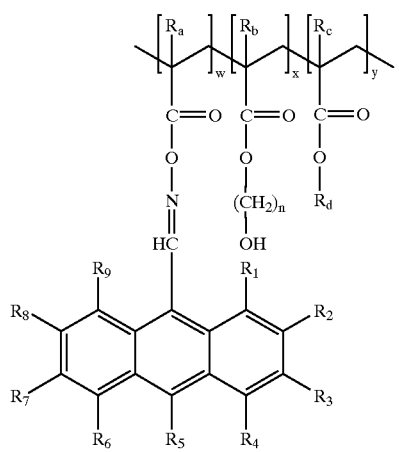

said method comprising the steps of polymerizing a mixture of monomers under conditions sufficient to produce said polymer, wherein said mixture of monomers comprises a 9-anthraldehydeoximeacrylate monomer of the formula:

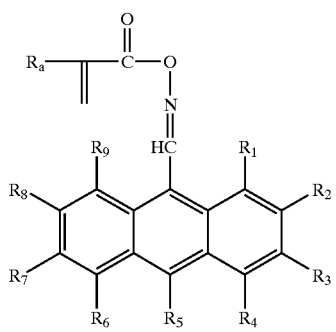

a hydroxyalkylacrylate monomer of the formula:

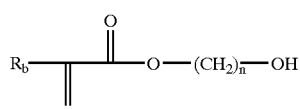

and an alkylacrylate monomer of the formula:

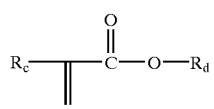

wherein $R_a$, $R_b$, and $R_c$ are independently hydrogen or alkyl;

$R_d$ is alkyl;

R₁ to R₉ are independently hydrogen, hydroxy, alkoxycarbonyl, carboxyl, hydroxyalkyl, or optionally substituted $C_1$–$C_5$ alkyl, or alkoxyalkyl;

w, x, and y are mole fractions, each of which is independently in the range of from 0.01 to 0.99; and n is an integer of 1 to 4.

16. The method of claim 15, wherein said mixture of monomers further comprises a polymerization initiator.

17. The method of claim 16, wherein the initiator is selected from the group consisting of 2,2-azobisisobutyronitrile, acetylperoxide, laurylperoxide, and t-butylperoxide.

18. The method of claim 16, wherein said mixture of monomers further comprises a solvent.

19. The method of claim 18, wherein said solvent is selected from the group consisting of tetrahydrofuran, toluene, benzene, methylethyl ketone and dioxane.

20. The method of claim 15, wherein said polymerization step comprises heating said mixture of monomers to temperature in the range of from about 50° C. to about 90° C.

21. An anti-reflective coating composition comprising a polymer selected from:

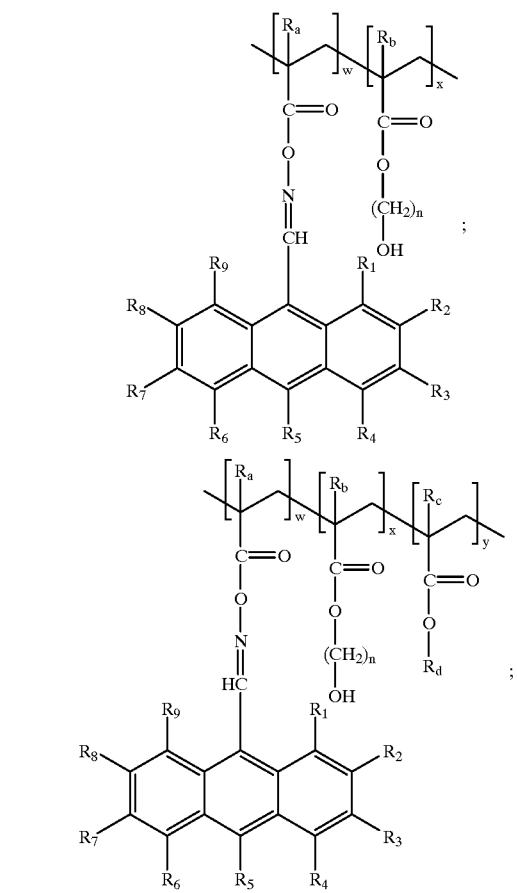

and mixtures thereof, wherein $R_a$, $R_b$, and $R_c$ are independently hydrogen or alkyl;

$R_d$ is alkyl;

R₁ to R₉ are independently hydrogen, hydroxy, alkoxycarbonyl, carboxyl, hydroxyalkyl, or optionally substituted $C_1$–$C_5$ alkyl, or alkoxyalkyl;

w, x, and y are mole fractions, each of which is independently in the range of from 0.01 to 0.99; and n is an integer of 1 to 4.

22. The anti-reflective coating composition of claim 21 further comprising a polymer of the formula:

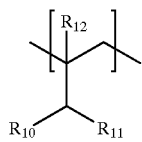

wherein
R$_{10}$ and R$_{11}$ are independently optionally substituted C$_1$–C$_{10}$ alkoxy; and
R$_{12}$ is hydrogen or alkyl.

23. The anti-reflective coating composition of claim 22 further comprising an additive selected from the group consisting of anthracene, 9-anthracenemethanol, 9-anthracenecarbonitrile, 9-anthracenecarboxylic acid, dithranol, 1,2,10-anthracenetriol, anthraflavonic acid, 9-anthraldehydeoxime, 9-anthraldehyde, 2-amino-7-methyl-5-oxo-5H-[1]benzopyrono[2,3-b]benzopyridine-3-carbonitrile, 1-aminoanthraquinone, anthraquinone-2-carboxylic acid, 1,5-dihydroxyanthraquinone, anthrone, 9-anthryltrifluoromethyl ketone, 9-alkylanthracene of the formula:

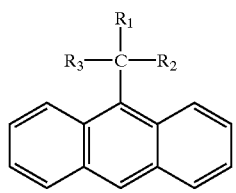

carboxylanthracene of the formula:

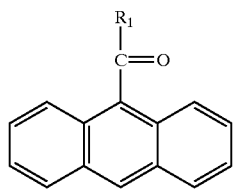

carboxylanthracene of the formula:

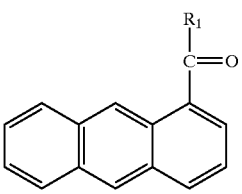

and mixtures thereof,
wherein
R$_1$, R$_2$, and R$_3$ are independently hydrogen, hydroxyl, alkyl, hydroxyalkyl, or optionally substituted C$_1$–C$_5$ alkyl, or alkoxyalkyl.

24. A method for preparing an anti-reflective coating on a substrate, said method comprising the steps of:
(a) admixing an organic solvent and an anti-reflective coating polymer to produce at least a partially dissolved anti-reflective coating polymer solution, wherein said anti-reflective coating polymer comprises a polymer of the formula:

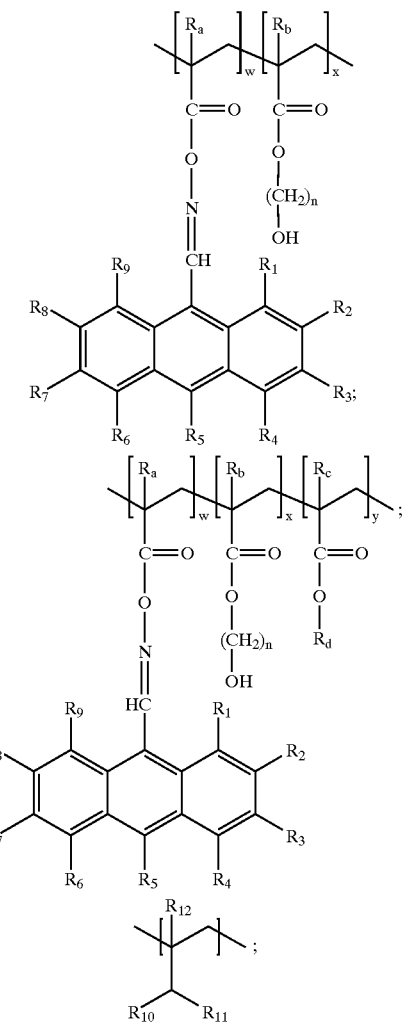

or mixtures thereof,
wherein
R$_a$, R$_b$, R$_c$, and R$_{12}$ are independently hydrogen or alkyl;
R$_d$ is alkyl;
R$_1$ to R$_9$ are independently hydrogen, hydroxy, alkoxycarbonyl, carboxyl, hydroxyalkyl, or optionally substituted C$_1$–C$_5$ alkyl, or alkoxyalkyl;
R$_{10}$ and R$_{11}$ are independently optionally substituted C$_1$–C$_{10}$ alkoxy;
w, x, and y are mole fractions, each of which is independently in the range of from 0.01 to 0.99; and
n is an integer of 1 to 4;
(b) coating said anti-reflective coating polymer solution on a substrate; and
(c) heating said coated substrate to form an anti-reflective polymer coated substrate.

25. The method of claim 24 further comprising the step of filtering said anti-reflective coating polymer solution prior to said coating step.

26. The method of claim 24, wherein said organic solvent is selected from the group consisting of ethyl 3-ethoxypropionate, methyl 3-methoxypropionate, cyclohexanone, propylene glycol methyletheracetate, and mixtures thereof.

27. The method of claim 26, wherein the amount of said organic solvent is from about 200 to about 5,000% by weight of the total weight of said anti-reflective coating polymer.

28. The method of claim 24, wherein said heating step comprises heating said coated substrate to temperature in the range of from about 100° C. to about 300° C.

29. The method of claim 24, wherein said anti-reflective coating polymer solution further comprises an additive selected from the group consisting of anthracene, 9-anthracenemethanol, 9-anthracenecarbonitrile, 9-anthracenecarboxylic acid, dithranol, 1,2,10-anthracenetriol, anthraflavonic acid, 9-anthraldehydeoxime, 9-anthraldehyde, 2-amino-7-methyl-5-oxo-5H-[1]benzopyrono[2,3-b]benzopyridine-3-carbonitrile, 1-aminoanthraquinone, anthraquinone-2-carboxylic acid, 1,5-dihydroxyanthraquinone, anthrone, 9-anthryltrifluoromethyl ketone, 9-alkylanthracene of the formula:

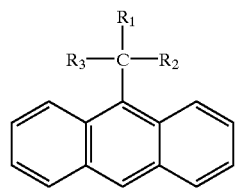

carboxylanthracene of the formula:

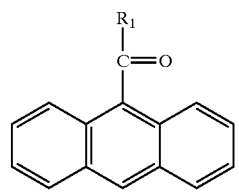

carboxylanthracene of the formula:

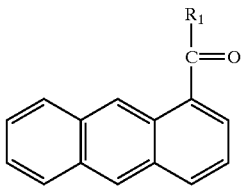

and mixtures thereof,
wherein
$R_1$, $R_2$, and $R_3$ are independently hydrogen, hydroxyl, alkyl, hydroxyalkyl, or optionally substituted $C_1$–$C_5$ alkyl, or alkoxyalkyl.

30. The method of claim 29, wherein the amount of said additive present in said anti-reflective coating polymer solution is in the range of from about 0.1 to about 30% by weight of said anti-reflective coating polymer solution.

* * * * *

UNITED STATES PATENT AND TRADEMARK OFFICE
CERTIFICATE OF CORRECTION

PATENT NO. : 6,548,613 B2
DATED : April 15, 2003
INVENTOR(S) : Min-Ho Jung, Sung-Eun Hong, Jae-Chang Jung, Geun-Su Lee and Ki-Ho Baik It is certified that error appears in the above-identified patent and that said Letters Patent is hereby corrected as shown below:

Column 4,
Lines 38-45, please replace Formula 5 with the following Formula 5:

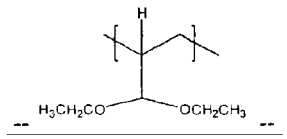

Signed and Sealed this

Twenty-second Day of June, 2004

JON W. DUDAS
*Acting Director of the United States Patent and Trademark Office*